United States Patent [19]

Dayton

[11] 4,311,921
[45] Jan. 19, 1982

[54] SINE-SQUARED PULSE SHAPING CIRCUIT

[75] Inventor: Birney D. Dayton, Nevada City, Calif.

[73] Assignee: The Grass Valley Group, Inc., Grass Valley, Calif.

[21] Appl. No.: 28,283

[22] Filed: Apr. 9, 1979

[51] Int. Cl.³ .................... H03K 5/22; H03K 5/00; H03K 5/08
[52] U.S. Cl. .................... 307/261; 307/494; 307/296 R; 328/36
[58] Field of Search .............. 307/260, 261, 268, 296, 307/494; 328/178, 144, 187, 36

[56] References Cited

U.S. PATENT DOCUMENTS

| | | | |
|---|---|---|---|
| 3,411,096 | 1/1968 | Rainger et al. | 328/151 |
| 3,793,480 | 2/1974 | Waehner | 328/144 |
| 3,868,519 | 2/1975 | Green | 307/268 |
| 4,019,118 | 4/1977 | Harwood | 328/144 |

*Primary Examiner*—Stanley D. Miller, Jr.
*Assistant Examiner*—B. P. Davis

[57] ABSTRACT

An electronic circuit which produces controlled rise and fall times with a sine-squared step pulse shape from rectangular input pulses is disclosed. The circuit uses the inherent nonlinear behavior of a bipolar transistor differential pair to shape the pulses and requires very little passive filtering. The output wave-shaped current may be developed across a resistor or fed to the input mode of a feedback amplifier.

9 Claims, 6 Drawing Figures

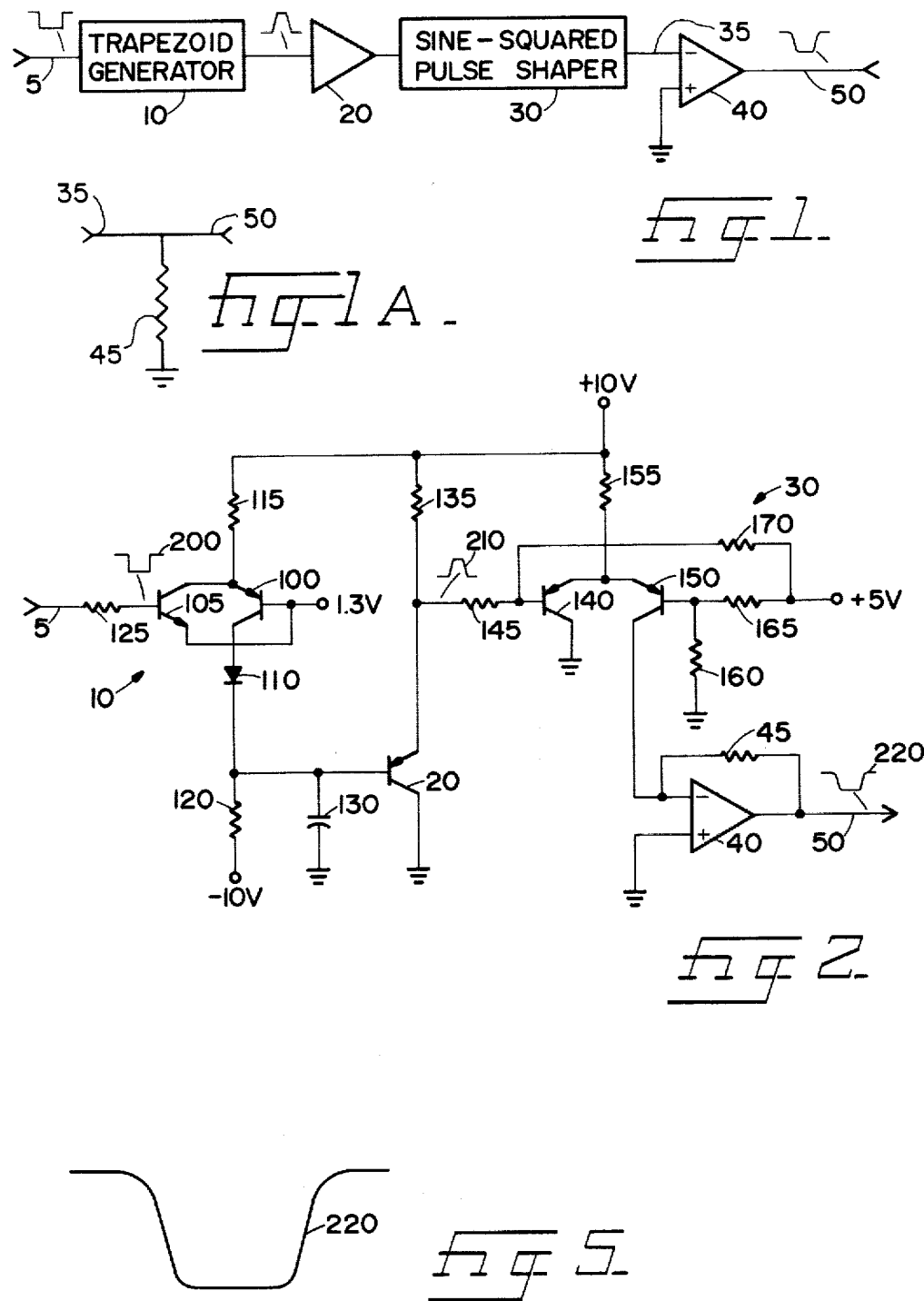

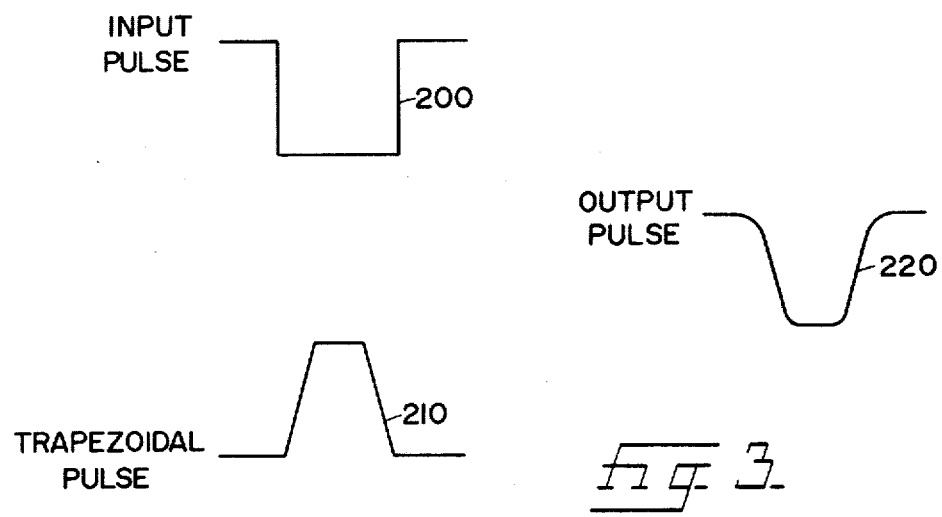
_Fig 3_
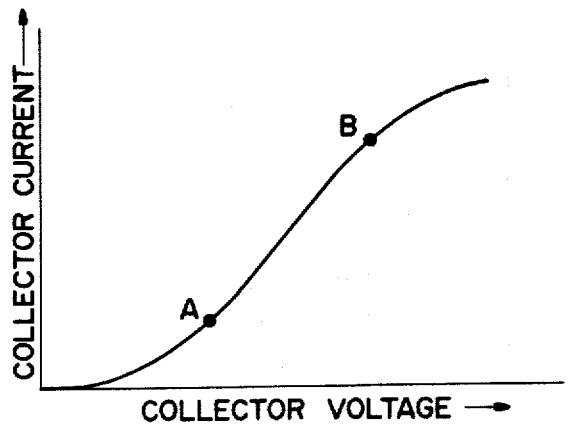
_Fig 4_

SINE-SQUARED PULSE SHAPING CIRCUIT

BACKGROUND OF THE INVENTION

This invention relates to an electronic circuit for shaping a rectangular pulse into a sine-squared step shape.

Sine-squared transitions are used throughout the television industry. They appear in the T, 2T pulse and bar and the 20T and modulated 20T test signals. They are also used to shape transitions of other television test and operating pulses.

Past approaches to sine-squared shaping of television pulse rise and fall times have involved the use of multi-element passive filters. In 1952, W. E. Thompson introduced, in his article "The Synthesis of a Network to Have a Sine-squared Impulse Response," Proceedings IEE (London), Vol. 99, Part III, p. 373, a method for synthesizing these filters and in 1970 A. Kastelein proposed, in his article "A New Sine-Squared Pulse and Bar Shaping Network," IEEE Transactions on Broadcasting, Vol. BC-16, No. 4, p. 84, improvements to the Thompson filter. These two approaches have been widely used in the television industry. Problems, however, have been encountered with these approaches because of their high cost and the difficulty in matching delays caused by the passive filter elements.

SUMMARY OF THE INVENTION

In a pulse shaping circuit according to the present invention, a rectangular input waveform having fast rise and fall transitions enters the circuit and is modified. The pulse first goes through a trapezoid generator which limits the rise and fall transitions of the input pulse. The trapezoidal signal is attenuated to just exceed the differential crossover voltage of a differential transistor pair. The trapezoidal signal is thus shaped according to the non-linear transfer characteristic of the differential transistor pair. The shaped wave current is then fed to an input mode of a current amplifier and exits the circuit as a pulse with sine-squared shaped rise and fall times. Only a small amount of passive filtering is required (one capacitor).

It is therefore an object of the present invention to provide a sine-squared pulse shaping circuit that contains very little passive filtering.

It is another object of the present invention to provide a sine-squared pulse shaping circuit that adds only minimal delay to the signal path.

Other objects and advantages will become apparent to those having ordinary skill in the art upon a reading of the following description when taken in conjunction with the accompanying drawing figures wherein like elements have like reference numerals.

BRIEF DESCRIPTION OF THE DRAWING

In the drawing:

FIG. 1 is a block diagram of a pulse shaping circuit according to the present invention;

FIG. 1a shows a resistor 45;

FIG. 2 is a schematic diagram of a pulse shaping circuit according to the present invention;

FIG. 3 is a representation of several waveforms present in the circuit of FIG. 2 as they would appear when displayed on an oscilloscope;

FIG. 4 is a drawing of the nonlinear response of a bipolar transistor; and

FIG. 5 is a representation of the output pulse produced by the circuit of FIG. 2.

DETAILED DESCRIPTION OF THE PREFERRED EMBODIMENT

Referring now to FIG. 1 therein is a block diagram representing a pulse shaping circuit according to the present invention.

The pulse to be shaped enters the circuit at input line 5 which is the input to a trapezoid generator 10. The output of the trapezoid generator is fed via buffer 20 to sine-squared pulse shaper 30. The output 35 of the pulse shaper is routed to amplifier 40 and then to output line 50.

By way of operation, a fast rise input pulse, shown as 200 in FIG. 3, has its rise and fall transitions limited by trapezoid generator 10. Trapezoid generator 10 may be of any conventional design such as that described in "Electronics Circuits Manual" by John Markus, copyright 1971 by McGraw-Hill, Inc., p. 624, which is incorporated herein by reference. Normally the rise and fall transitions of the output trapezoidal pulse 210 would be set to be equal. However, they may be unequal and the output of the sine-squared shaping circuit will still have sine-squared transitions. The amplitude of the trapezoidal pulse is limited so as to properly operate the sine-squared pulse shaper 30. The sine-squared shaped current may be developed across a resistor 45, as illustrated in FIG. 1A, or some other output means such as the current amplifier 40 shown in FIG. 1. The amplified sine-squared pulse 220 exits the circuit at line 50 with sine-squared transitions and the same width as the input pulse 200.

FIG. 2 shows schematically a sine-squared pulse shaping circuit constructed according to the present invention. For illustrative purposes only, the input pulse which is to be shaped is shown as a 5-volt essentially rectangular pulse.

The input pulse 200 is fed into the base of NPN transistor 105 through resistor 125. The collector of transistor 105 is connected to the emitter of PNP transistor 100 and the emitter of transistor 105 is connected to the base of transistor 100. The base of transistor 100 is also connected to a source of 1.3 volts. Resistor 115 has one end connected to the emitter of transistor 100 and the collector of transistor 105 and the other end thereof connected to a 10-volt voltage source. The collector of transistor 100 is connected via diode 110 to a resistor 120 which has its other end connected to a source of −10 volts. The cathode of diode 110 is connected to the base of PNP buffer transistor 20. Capacitor 130 has one terminal grounded and the other connected between the base of transistor 20 and the cathode of diode 110. The collector of buffer transistor 20 is connected to ground and the emitter thereof is coupled via resistor 135 to a 10-volt supply and via resistor 145 to the base of the PNP transistor 140. The collector of transistor 140 is connected to ground and the emitter thereof is coupled to the emitter of PNP transistor 150. One end of resistor 155 is connected to a 10-volt voltage source and the other end thereof is connected between the emitter of transistor 140 and the emitter of transistor 150. The base of transistor 150 is connected to a 5-volt source through resistor 165 and to ground via resistor 160. Connected between one end of resistor 165 and the base of transistor 140 is resistor 170.

The output of the sine-squared pulse shaping transistor pair 140/150 is taken at the collector of transistor 150 which is connected to the inverting input of amplifier 40. The non-inverting input of amplifier 40 is connected to ground. Resistor 45 has one end connected to the output terminal of amplifier 40 and the other end thereof is connected to the inverting input of amplifier 40.

By way of operation, the input pulse 200 enters the circuit on line 5. As mentioned previously, input pulse 200 is essentially rectangular in shape. Transistor 105 inverts the input pulse. This inverted pulse is fed to transistor 100. Transistor 100 produces a charging current into capacitor 130 during the positive transition of the input pulse. This produces a ramp-shaped positive transition on the pulse present at the base of transistor 20. During the negative transition of the input pulse, current from the −10-volt source, developed by resistor 120, produces a ramp-shaped negative transition on the pulse at the base of transistor 20. Transistor 20 acts as a buffer for the resulting trapezoidal pulse that is developed at the base thereof.

The trapezoidal current pulse 210 is fed to differential transistor pair 140-150. Through proper selection of resistors 135, 145, 155, 160, and 165 the differential pair is biased so that each transistor operates in its nonlinear region. FIG. 4 depicts the transfer characteristic of a typical bipolar transistor such as those used in the present invention. For normal linear operation of this transistor, an operating point would be selected so that a linear transfer characteristic such as that shown between points A and B on the transfer curve of FIG. 4 is obtained. However, in the present invention the transistor is biased so as to produce the entire transfer characteristic shown in FIG. 4. In one embodiment of the present invention the following resistor values were used to obtain the desired biasing:

| Resistor | Value (Ohms) |
|---|---|
| 135 | 3010, ±5% |
| 145 | 2150, ±1% |
| 155 | 10,000, ±5% |
| 160 | 2940, ±1% |
| 165 | 499, ±1% |

The above values are for illustrative purposes only and the applicant does not wish to be limited by them.

Both transistor 140 and 150 are biased to operate nonlinearly. Therefore, the positive and negative ramp-shaped transitions of the trapezoidal pulse are converted to those shown in FIG. 5 which depicts the current pulse output at the collector of transistor 150. The width of the output current pulse is the same as that of the input pulse. This current may be developed across a resistor 45 connected to ground or other suitable voltage. Or as shown in FIG. 2, the current may be fed to the input of a current amplifier such as that shown therein. The feedback amplifier shown provides, among other benefits, level-shifting capability and improved output linearity.

Thus, there has been shown an active electronic circuit which generates controlled rise and fall times with a sine-squared step shape for rectangular input pulses. The circuit uses the non-linear transfer characteristics of a pair of differentially connected bipolar transistors to produce the desired sine-squared shaping. Since only one reactive device is used very little delay is introduced.

While there has been shown and described a preferred embodiment of the present invention, it will be apparent to those skilled in the art that many changes and modifications may be made without departing from the invention in its broader aspects. Therefore, the appended claims are intended to cover all such changes and modifications that fall within the scope of this invention.

I claim as my invention:

1. An electronic circuit for producing controlled rise and fall times with a sine-squared shape from rectangular input current pulses, the circuit comprising:
   a means for converting the rectangular input current pulses to trapezoidal current pulses;
   a buffer amplifier coupled to said converting means for receiving and buffering said trapezoidal current pulses; and
   a sine-squared pulse shaping circuit comprising a pair of differentially connected transistors biased so as to operate over the nonlinear portion of their operating range and coupled to said buffer amplifier for receiving and converting said trapezoidal current pulses to sine-squared current pulses.

2. The electronic circuit according to claim 1 wherein said sine-squared pulse shaping circuit comprises a pair of differentially connected transistors biased so as to operate over the nonlinear portion of their operating range.

3. An electronic circuit for producing controlled rise and fall times with a sine-squared shape from input trapezoidal current pulses, the circuit comprising:
   a buffer amplifier coupled so as to receive and buffer said input trapezoidal current pulses; and
   a pair of differentially connected transistors biased so as to operate over the nonlinear portion of their operating range coupled to said buffer amplifier for receiving and shaping said buffered trapezoidal current pulses into sine-squared shaped current pulses.

4. An electronic circuit for producing controlled rise and fall times with a sine-squared shape from input trapezoidal current pulses, the circuit comprising:
   a pair of differentially connected transistors biased so as to operate over the nonlinear portion of their operating range coupled to receive and shape the input trapezoidal current pulses into sine-squared shaped current pulses.

5. The electronic circuit according to claim 4 further comprising a buffer amplifier coupled so as to receive and buffer the input trapezoidal current pulses, the output thereof being the input to said differential pair.

6. The electronic circuit according to claims 3, 4, or 7 further including means for developing said sine-squared shaped current pulses thereacross.

7. The electronic circuit according to claim 1, 3, or 5 wherein said buffer amplifier comprises an emitter follower transistor amplifier.

8. The electronic circuit according to claim 6 wherein said means for developing comprises a resistor connected to a reference potential.

9. The electronic circuit according to claim 6 wherein said means for developing comprises a feedback amplifier.

* * * * *